United States Patent [19]

Cheng et al.

[11] Patent Number: 4,829,347

[45] Date of Patent: May 9, 1989

[54] PROCESS FOR MAKING INDIUM GALLIUM ARSENIDE DEVICES

[75] Inventors: Chu-Liang Cheng, Piscataway; Julian Cheng; Stephen R. Forrest, both of Chatham, all of N.J.

[73] Assignee: American Telephone and Telegraph Company, AT&T Bell Laboratories, Murray Hill, N.J.

[21] Appl. No.: 236,337

[22] Filed: Aug. 22, 1988

Related U.S. Application Data

[63] Continuation of Ser. No. 11,699, Feb. 6, 1987, abandoned, which is a continuation of Ser. No. 653,879, Sep. 25, 1984, abandoned.

[51] Int. Cl.$^4$ ............................................. H01L 29/80
[52] U.S. Cl. ........................................ 357/22; 357/16; 357/55
[58] Field of Search .................. 357/22 A, 16, 55, 4

[56] References Cited

U.S. PATENT DOCUMENTS

| | | | |
|---|---|---|---|
| 4,048,712 | 9/1977 | Buiatti | 357/22 X |
| 4,075,652 | 2/1978 | Umebachi | 357/55 X |
| 4,236,166 | 11/1980 | Cho et al. | 357/22 |
| 4,424,525 | 1/1984 | Mimura | 357/23.1 |
| 4,549,197 | 10/1985 | Brehan | 357/15 |

OTHER PUBLICATIONS

Umbachi et al, *Elect. Devices*, Aug. 1975, pp. 613–614.
"In$_{0.53}$Ga$_{0.47}$As Submicrometer FET's Grown by MBE", *IEEE Electron Device Letters*, vol. EDL-4, No. 7, Jul. 1983, pp. 252–254.
Part B: "Materials and Operating Characteristics", *Heterostructure Lasers*, Academic Press, New York, 1978, by H. C. Casey, Jr. and M. B. Panish.
"A Self-Aligned In$_{0.53}$Ga$_{0.47}$As Junction Field Effect Transistor Grown by Molecular Beam Epitaxy", *IEEE Electron Device Letters*, vol. EDL-5, No. 7, Jul. 1984, pp. 285–287.

Primary Examiner—Martin H. Edlow
Attorney, Agent, or Firm—Walter G. Nilsen

[57] ABSTRACT

Junction field effect transistors are described with unusually short gates and a self-aligned structure which permits close approach of the source and drain electrodes to the p-n junction. Such devices have high speed, high gain and are usefully combined with other field effect transistors in integrated circuits.

40 Claims, 1 Drawing Sheet

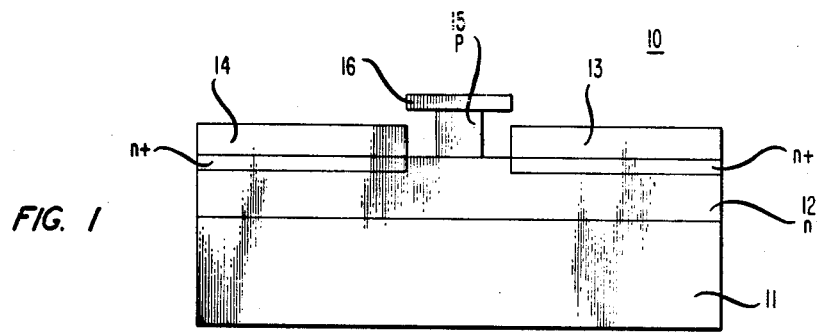
FIG. 1
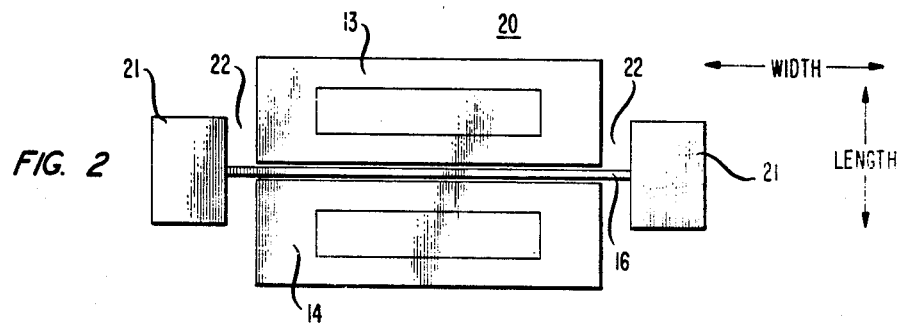
FIG. 2
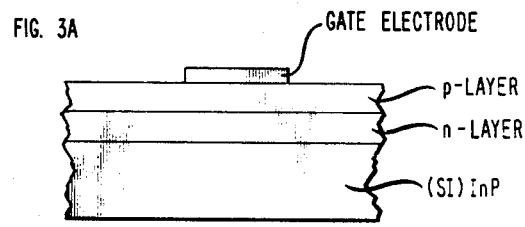
FIG. 3A
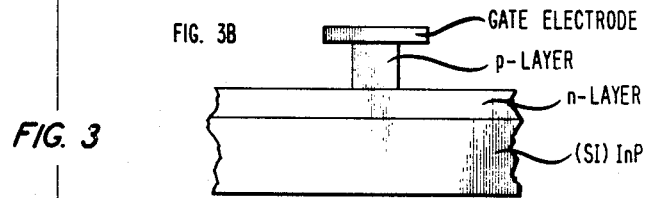
FIG. 3B
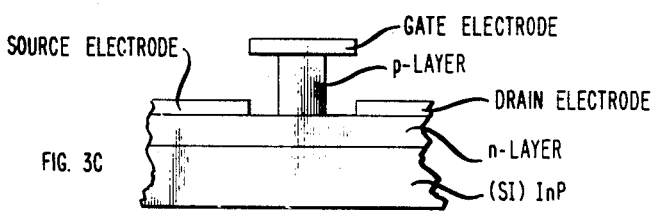
FIG. 3C
FIG. 3

PROCESS FOR MAKING INDIUM GALLIUM ARSENIDE DEVICES

This application is a continuation of application Ser. No. 011,699, filed Feb. 6, 1987, now abandoned, which is a continuation of application Ser. No. 653,879, filed Sept. 25, 1984, now abandoned.

TECHNICAL FIELD

The invention relates to semiconductor circuits, in particular to semiconductor circuits comprising field effect transistors.

BACKGROUND OF THE INVENTION

Rapid development in both commuication technology and computer technology has led to the requirement of higher speed circuits, more sensitive circuits and higher gain circuits. Such requirements have arisen at the same time as the further development of integrated circuit technology in which high packing densities in integrated circuits has become highly desirable.

Optical communication technology provides an illustrative example. Optical commuication has been developing at a rapid rate during the last few years. High sensitivity in receivers is desirable because it increases the distance between repeaters and reduces the number of repeaters in a particular communication system. Also of importance in optical communication systems is high speed amplifiers which permit high bit rates to be transmitted. High speed amplifier systems are also of use in other types of circuits including logic circuits, memory circuits, analog switching, high-input-impedance amplifiers, integrated circuits, etc.

One of the most promising semiconductor compounds for high speed, high gain devices is indium gallium arsenide and related compounds such as indium gallium arsenide phosphide. This is due to the high mobility and peak electron velocity exhibited by this III-V semiconductor compound. A particular difficulty is in fabricating suitable devices to take advantage of these properties. For example, metal-semiconductor field effect transistors (MESFETs) have extremely low barrier heights between the indium gallium arsenide and the contact metal which precludes fabrication of high-sensitivity field effect transistors by this procedure. Various corrective measures can be used to improve the barrier height characteristics but a reliable process to produce such devices with reproducible characteristics has not been found. For example, barrier heights can be enhanced by interposing a thin layer of insulator material or wide band-gap semiconductor between metal and channel layer but such devices are very difficult to fabricate and small process variations result in unwanted variations in performance.

Junction field effect transistors provide another device configuration in which high electron mobility materials could be used effectively to make high speed devices. Such devices have been discussed in a reference by Y. G. Chai and R. Yeats entitled "$In_{0.53}Ga_{0.47}As$ Submicrometer FET's Grown by MBE," *IEEE Electron Device Letters*, Vol. EDL-4, No. 7, July 1983, pages 252–254.

An important characteristic of field effect transistors is the transconductance of such devices, usually defined as the partial derivative of the drain-to-source current with respect to the gate-to-source voltage. Short gate lengths and close proximity of gate-to-drain and scurce electrodes are imperative for good performance of the junction field effect transistor.

SUMMARY OF THE INVENTION

The invention is a junction field effect transistor (JFET) structure which has self-alignment to ensure a short gate structure and close proximity between gate electrode and the drain and source electrodes. The JFET structure comprises substrate (usually semi-insulating indium phosphide) topped with a layer of n-type III-V semiconductor. Situated on the n-type semiconductor layer are source and drain electrodes in close proximity but not electrically touching a post of p-type semiconductor material. The p-type material is topped with a gate electrode which slightly overhangs the post of p-type semiconductor material. The length of the gate electrode is substantially less than or equal to the distance between source and drain electrodes. A preferred structure includes an air bridge between gate electrode and gate pad which isolates the pad from the active p-n junction and ensures isolation of the electrical capacitance of the pad from the gate electrode.

The substrate is generally made of semi-insulating InP. Other substrate structures may also be used, in particular InP (n-type, p-type or semi-insulating), topped with an epitaxial buffer layer which is semi-insulating. Such a buffer layer might be InP put down by standard epitaxial procedures, (e.g., metalorganic chemical vapor deposition or organometallic vapor phase epitaxy, liquid phase epitaxy, vapor phase epitaxy, molecular beam epitaxy, etc.). Other buffer layers might be semi-insulating compositions (or even insulating compositions) lattice matched to InP including ternary and quaternary III-V compounds (e.g., InAlAs). Semi-insulating material usually has resistivities of approximately $10^4$–$10^8$ ohm-cm and preferably resistivities of at least $10^7$–$10^8$ ohm-cm.

The preferred fabrication procedure involves the use of a self-alignment or top-alignment procedure in which an etchant is used to etch the p-type layer without substantially etching the n-layer and the etch is used to undercut the gate electrode to form a cap used in aligning the source and drain electrodes.

Various combinations of materials may be used in the practice of the invention. Because the substrate is InP, the materials are either InP or semiconducting compounds lattice matched to InP. Close lattice matching is preferred (say less than 0.1 percent), although greater mismatches may be of interest for special applications.

The most important of these lattice matched materials is InGaAs (composition of approximately $In_{0.53}Ga_{0.47}As$ for lattice matching). Also useful are the semiconductor compounds InGaAsP, InGaAlAs and InAlAs ($In_{0.48}Al_{0.52}As$) that are lattice matched to InP. The n-type layer and p-type layer compositions may be the same (except for doping) or different. Typical examples are as follows: (1) both the n-type layer and the p-type layer may be InGaAs; (2) both the n-type layer and the p-type layer may be InP; the n-type layer may be InGaAs and the p-type layer InP; or (4) the n-type layer InP and the p-type layer InGaAs. The other ternary and quaternary semiconductor compounds mentioned above can also be used in either the n-layer or p-layer. Each combination has advantages either from a device point of view (speed, transconductance, ease of fabrication, etc.) or from a fabrication point of view. An air bridge is used to connect gate electrodes to the gate bonding pad so as to isolate the pad capacitance from the gate. Various integrated circuits may be made using the described structure and process including logic circuits, memory circuits, analog switching circuits, high-input-impedance amplifiers, driver circuits for lasers, etc.

BRIEF DESCRIPTION OF THE DRAWING

FIG. 1 shows a side view of a section of a junction field effect transistor with structure and fabrication method in accordance with the invention;

FIG. 2 shows a top view of the junction field effect transistor showing in addition to that shown in FIG. 1 the air bridge and gate pads; and FIG. 3 shows a series of side views of the junction field effect transistor as it is being fabricated in accordance with the invention.

DETAILED DESCRIPTION

The invention is a top-aligned or self-aligned junction field effect transistor (JFET) structure which is relatively easy to fabricate and a process for fabricating such devices. The distinctive feature of the JFET structure is a metal gate electrode which overhangs a post of p-type semiconductor material. This p-type material forms part of a p-n junction and the source and drain electrodes are in close proximity to the gate electrode. Typical separations between source or drain electrodes and the gate electrode are less than 2 $\mu$m or even 1 $\mu$m or preferably 0.5 $\mu$m. It is the "T" type structure (gate electrode forming the top of the "T" and p-type semiconductor post forming the vertical line) or "dovetail" structure that permits the close alignment of source electrode and drain electrode to the gate electrode, without the use of any special alignment or realignment procedure such as a photoresist alignment procedure. The gate electrode merely forms a shadow mask which prevents evaporated metal used in making the source and drain electrodes from reaching the post of p-type material or shorting out the p-n junction. Since the undercut of p-type material can be made very small (typically between 0.3 and 1.0 or even 0.3 and 0.5 $\mu$m), close proximity of the source and drain electrodes to the p-n junction without alignment, or without the danger that the source or drain electrodes will touch the p-type material is possible.

Another feature of the invention is an air bridge between the gate electrode and the gate bonding pad which ensures that the unwanted electrical characteristics of the gate bonding pad (capacitance, resistance, etc.) do not degrade device performance. The air bridge is made by an undercutting etching process described more fully below.

The invention may be illustrated by the description of a typical JFET structure made in accordance with the invention. A cross section of a JFET structure is shown in FIG. 1. The JFET structure 10 is made of substrate of semi-insulating indium phosphide 11 topped with a layer 12 of n-type semiconducting indium gallium arsenide. On top of this layer is the drain elecrode 13 and source electrode 14 usually made of gold-germanium, gold-silicon, or gold-tin and usually heat treated to make the contact ohmic. Between the source and drain is a small post of p-type semiconductor 15 which together with the n-type semiconductor forms the p-n junction of the structure. The gate electrode 16 sits on top of the p-type semiconductor post, generally overhanging the post by about 0.1 to 1.0$\mu$. It is generally made of alloys of gold, such as palladium-gold or zinc-gold, or nonalloy materials such as chromium-gold, although other electrode materials might be used.

Particularly desirable is a short post of p-type material. Typically, the length of the post is less than 5 $\mu$m or even 2 $\mu$m or 1 $\mu$m.

An essential feature of this structure is the overhang of the gate electrode 16 over the post of p-type material 15. It is this overhang over the post of p-type material that permits close alignment of the source and drain electrodes to the p-n junction without any special realignment procedure. The amount of overhang is controlled by undercutting in the etch process that removes most of the p-layer. The source and drain electrodes are generally made by evaporation and the amount of overhang on the gate electrode determines how close the source and drain electrodes are to the p-n junction. Implantation prior to evaporation may be used to make suitable source and drain electrodes (generally to make them ohmic and to reduce the contact resistance) or various alloys or mixtures of metals may be used for the same purpose.

FIG. 2 shows a top view 20 of the same structure with drain electrode 13, source electrode 14 and gate electrode 15. Also shown are the gate pads 21 and part of the gate electrode where the air bridge is located 22.

It should be recognized that the above-described structure can be made with a large variety of semiconductor materials. For example, the substrate, n-type and p-type materials may be the same, two the same and one different or all different.

Preferred are semiconductor material systems which have high carrier mobilities and velocities and small semiconductor barriers, or materials related (generally by lattice matching) to such materials. Included in these materials are indium phosphide, indium gallium arsenide (generally with approximate composition $Ga_{0.47}In_{0.53}As$ that is lattice matched to indium phosphide) indium aluminum arsenide ($Al_{0.48}In_{0.52}As$) and quaternary compounds such as indium gallium arsenide phosphide and indium gallium aluminum arsenide with compositions that are lattice matched to indium phosphide.

Such compositions are outlined in a book by H. C. Casey, Jr. and M. B. Panish entitled *Heterostructure Lasers*, Academic Press, New York, 1978, particularly Part B: "Material and Operating Characteristics."

Most convenient is the use of $Ga_{0.47}In_{0.53}As$ as the n-type material and InP or $Ga_{0.47}In_{0.53}As$ as the p-type material.

It is convenient here to outline the various preferred dopants used for the p-type layers and n-type layers and the preferred concentrations of these dopants. It should be realized that these are typical dopants and typical concentration ranges and the invention may be practiced with other dopants and other dopant concentration ranges. Also, dopant concentration may vary through the thickness of the various layers and may be made unusually high near the various electrodes to improve electrical contact characteristics. Typical n-type dopants are Sn, Si, S and Te with typical concentration ranges between $10^{16}$ and $10^{17}$ atoms/cc. For InP and InAlAs, most preferred is in the range from $8-9 \times 10^{16}$ atoms/cc, for InGaAs, $4-7 \times 10^{16}$ atmos/cc and for InGaAsP $6-8 \times 10^{16}$ atmos-cc. For the p-type layer, typical dopants are Cd, Zn, Mg and Be with doping concentration ranges of $10^{18}-10^{19}$ atoms/cc. Near the gate electrode, the doping concentration may exceed this range (often approaching $10^{20}$ atoms/cm$^2$)

so as to obtain low resistance, ohmic contact between electrode and p-layer.

The thickness of the n-layer and p-layer may vary over large limits depending on desired application. Thicknesses of a few $\mu m$ may be useful. Usually, thicknesses of less than 1 $\mu m$ are preferred. The thickness of the n-layer generally depends on the material, doping concentration, desired characteristics of the device, etc., but usually is in the range from 0.1 to 0.7 $\mu m$. The thickness of the p-layer is also usually less than 1 $\mu m$. Often, thickness of the p-layer is close to the desired undercut under the gate electrode, often approximately 0.5 $\mu m$.

Fabrication of the device is most easily shown by reference to FIG. 3. Shown in FIG. 3 and described below is one device (FET) on a wafer (or chip) that contains many such devices. Other types of devices (circuit elements, etc.) may be present on the wafer or chip. The substrate is made of semi-insulating indium phosphide typically doped with iron to compensate for unwanted impurities and make the substrate semi-insulating. Standard procedures are used to put down a layer of n-type material (e.g., $Ga_{0.47}In_{0.53}As$) and a layer of p-type material (e.g., InP). These layers are put down by standard procedures well known in the art and although their thickness may vary over large limits, are usually less than a micron (0.1–0.8 $\mu m$).

Such standard procedures include molecular beam epitaxy deposition (MBE), metalorganic chemical vapor deposition (MOCVD), or organo-metallic vapor phase epitaxy (OMVPE), vapor phase epitaxy (VPE), and liquid phase epitaxy (LPE). The gate electrode is then made using standard photoresist techniques so as to produce a short gate (typically less than 2 $\mu m$) using a metal system that produces an ohmic contact on p-type III-V semiconductor compounds (e.g., palladium-gold, chromium-gold, zinc-gold, etc.). Usually, the metal layer is put down on the p-layer over an area larger than needed for the gate and a photoresist procedure used to etch away or lift away metal except for the gate metallization. This leaves a structure such as that shown in FIG. 3A.

A note on nomenclature might be of use at this point. The length of the gate electrode refers to the dimension in the plane of FIG. 1 and parallel to the surface between substrate and n-type semiconductor. It is marked with a double arrow above the gate electrode. The width of the gate electrode is the dimension perpendicular to the plane of the paper in FIG. 1.

A critical part of the fabrication procedure is removal of the p-layer (including some undercutting of the gate electrode) without substantially affecting the n-layer or substrate. Generally, the exact procedure depends on the nature of the III-V semiconductor material in the n-layer and p-layer.

Particularly important in the practice of the invention is obtaining a suitable shape for the post p-type material so that the gate electrode acts as an effective shadow mask and the evaporated source and drain electrodes do not touch the p-type material of the post. This means that the walls of the post should be essentially straight up and down (perpendicular to the plane of the n-type material shown in FIG. 1) or shorter at the base in contact with the n-type material than the top in contact with the gate electrode.

The desired shape of the post of p-type material can often be obtained by taking advantage of the anisotropic nature of etching rates in III-V semiconductor compounds. For example, InP (and related compounds of interest here) etches at different rates along different crystallographic directions (at least with some etch systems) and this characteristic can be used to shape the post of p-type material so the gate electrode acts as an effective shadow mask.

For example, p-type InP (and the related compounds mentioned in this application that can be used as the p-type material) etches most rapidly in the $<001>$ direction but most slowly in the $<111>$ direction using certain etches (e.g., $HCl+H_3PO_4$). By proper orientation of the gate electrode on the semiconductor compound, the post of the p-type semiconductor material can be undercut beneath the top gate metallization so as to make the gate electrode an effective mask in the fabrication of the source and drain electrodes.

For example, devices are usually put on the {100} face of the InP substrates. Alignment of the width of the gate electrode along (or close to) the $<011>$ direction usually assures proper shaping of the post of p-type material.

Various kinds of etch systems may be used depending on the combination of materials and results desired. Generally, well controlled and uniform etch systems are preferred—particularly where electrical measurements are used to determine where the etching process should be stopped.

A large variety of etch systems may be used in the practice of the invention. It should be noted that the etch need not be selective to the p-type material. Generally, a nonselective etch may be used and suitable monitoring used to stop the etch at the appropriate time. A typical monitoring system is described below. Some typical etching systems that can be used for various material combinations will now be discussed.

1. Both the n-layer and the p-layer are InGaAs lattice matched to InP (generally composition of $In_{0.53}Ga_{0.47}As$) or InGaAsP lattice matched to InP. A typical etch system is citric acid—aqueous hydrogen peroxide at room temperature. Typical composition is 50 weight percent citric acid in water diluted with an equal volume of concentrated (about 30 weight percent) aqueous hydrogen peroxide. The temperature of the etch solution and the composition of the etch solution may be varied to adjust the etch rate. Generally, this etching system does not distinguish between the p-layer and the n-layer but a monitoring procedure is used to monitor the progress of the etch procedure. The current-voltage characteristics between different (usually adjacent) gate electrodes is measured and the etch is stopped when the resistive characteristics (through the p-layer) have disappeared and only back-to-back diode characteristics (each diode between the p-layer of the post and n-layer) remain. This indicates that the p-layer has been removed except for the p-layer post under the gate electrode.

2. Both p-layer and n-layer are InP. Typical etches are hydrochloric-phosphoric acid (typically in the volume ratio of one-to-four using concentrated hydrochloric acid) sometimes with small amounts of hydrogen peroxide added, or alternatively bromine-methanol (usually dilute solution). The same monitoring technique can be used as described above.

3. P-layer InGaAs (or InGaAsP, lattice matched to InP) and n-layer InP. A typical etch is citric acid—aqueous hydrogen peroxide mentioned above. The etch will remove the p-layer and stop at the n-type InP. The etch rate is about 800–1200 Angstroms/minute.

The same monitoring procedure as described above can be used to observe the progress of the etching process. However, since the etch rate greatly decreases on reaching the InP, this technique is largely self-stopping and thus electrical monitoring is not essential.

4. P-layer is InP and n-layer is InGaAs or InGaAsP lattice matched to InP. A typical etch is HCl: phosphoric acid (composition described above) which etches InP but not InGaAs or InGaAsP. Again, the etching process can be monitored as described above. Although, once again this is not essential to successful processing. The invention has been discussed mostly in terms of the use of semi-insulating InP as the substrate. Typically, the n-type InP is doped with iron, generally in the concentration range from $10^{16}$–$10^{18}$ atoms/cm$^2$ (depending on impurity concentration) to obtain semi-insulating properties. Other types of substrates may be used provided such substrates yield sufficient resistivities for device use. For example, highly dopedInP (e.g., n+ InP) may be used (since it is easier to grow at low defect density) with a buffer layer of semi-insulating (usually Fe doped) InP. Other semi-insulating layers may be used such as InAlAs.

The source electrode and drain electrode are now deposited by more or less conventional means. A photoresist technique is used to define the area for the source and drain electrodes. Evaporation is conveniently used in putting down these electrodes and the gate electrode overhangs over the post of p-type material used as a shadow mask to self-align the source electrode to the post of p-type material and to self-align the drain electrode to the post of p-type material. A variety of metallization systems may be used provided it forms a suitable electrical contact (ohmic contact) to the n-type material. Typically, Ge-Au or Si-Au with moderate annealing (typically 200–450 degrees C.) are used. Ion implantation followed by metallization (e.g., Au) with annealing is also useful. On removal of the photoresist, this leaves the structure shown in FIG. 3C.

Next, the air bridge is constructed by suitable etching of the p-layer and n-layer under the gate electrode between the gate pad (number 21 of FIG. 2) and the portion of the gate electrode close to the source and drain electrodes. This can be done in a variety of ways. Typically, photoresist techniques are used to protect most of the circuit except where the air bridge and gate bonding pad and FET isolation mesa are to be made. Then, an etch is selected which will etch both the n-type layer and the p-type layer without etching the gate metal. Typical etches are citric acid-hydrogen peroxide referred to above especially for InGaAs layers and dilute bromine in methanol (typically 0.1 weight percent) or a $H_3PO_4$:HCl:$H_2O_2$ solution. The invention may be illustrated by a number of examples.

EXAMPLE 1

The following layers were put down on a semi-insulating (Fe-doped) InP substrate by standard epitaxial means: (a) 4000 Angstroms of n-InGaAs doped with Si at a concentration level of $6 \times 10^{16}$ atoms/cm$^3$, (b) 5500 Angstroms of p-InGaAs doped with Be at a concentration level of $5 \times 10^{19}$ atoms/cm$^3$. A Cr-Au gate metal pattern 2000 Angstroms thick and 2 μm in length was defined by lift-off lithography. The 6000 Angstrom thickness of p-InGaAs was etched, and the gate metal undercut, using a 1 citric acid: 1 $H_2O_2$ etching solution with an etch rate of 1000 Angstroms/min. at 23 degrees C. Self-aligned source and drain metal patterns consisting of 1500 Angstroms of a Au-Ge alloy were then deposited. The mesa was then etched and the air bridge formed using a photoresist pattern that protects the active device area and a 1 citric acid: 1 $H_2O_2$ etching solution. After annealing the alloy contacts, the devices showed excellent JFET characteristics, with a peak transconductance of 110 mS/mm at a gate-to-source voltage of 0 volt, a gate-to-source capacitance of 0.8 pfd/mm, a leakage current density of $10^{-1}$ amp/cm$^2$ at −3v, low hysteresis, a pinch-off voltage of −6 volts between gate and source, and a saturation-drain current $I_{DSS}$ as high as 45 mA.

EXAMPLE 2

A slab of sulfur doped n+-InP was provided with a 1 μm thick layer semi-insulating (Fe-doped) InP grown by metal-organic chemical vapor deposition. On top of this semi-insulating layer, the following epitaxial layers were provided: (a) 4000 Angstroms of Si-doped n-InGaAs with concentration $2 \times 10^{16}$ atoms/cm$^3$ and (b) 6000 Angstroms of Be-doped p-InGaAs with a concentration of $5 \times 10^{18}$ atom/cm$^3$. The fabrication procedure was the same as in Example 1. The JFET characteristics show a transconductance of 65 mS/mm, a gate-to-source capacitance of 2 pfd/mm, a leakage current density of $10^{-2}$ amp/cm$^2$ at −2v, and a saturation current of 30 mA.

EXAMPLE 3

A slab of n+-InP was provided with a 1 μm-thick layer of undoped InAlAs. This substrate structure was provided with the following epitaxial layers: (a) 4000 Angstroms of Si doped n-InGaAs with concentration of $2 \times 10^{16}$ atoms/cm$^3$, and (b) 6000 Angstroms of Be-doped p-InGaAs with concentration $5 \times 10^{18}$ atoms/cm$^3$. The fabrication procedure was the same as in Example 1. The JFETs possessed a transconductance of 80 mS/mm, a capacitance of 2.5 pfd/mm, a leakage current of $10^{-1}$ amp/cm$^2$ at −2 volts, and a saturation current of 10 mA.

What is claimed is:

1. A semiconductor device comprising at least one junction field effect transistor, said junction field effect transistor comprising:
    a. first epitaxial region comprising III-V semiconductor compound with n-type conductivity;
    b. second epitaxial region comprising III-V semiconductor compound with p-type conductivity and contacting at least a portion of the first epitaxial region said second epitaxial region having a length;
    c. source and drain electrodes, said source and drain electrodes contacting said first epitaxial region;
    d. gate electrode contacting said second epitaxial region and having a length;

characterized in that
    1. The gate electrode is positioned on the second epitaxial region so that it overhangs the second epitaxial region;
    2. The length of the gate electrode is less than or equal to the distance between source and drain electrodes;
    3. The length of said second epitaxial region measured along its interface with said first epitaxial region is less than the length of the gate electrode;
    4. The first epitaxial layer and the second epitaxial layer comprise III-V semiconductor compounds approximately lattice matched to indium phosphide;

5. The bottom of the plane of the metallization of the gate electrode is above the top of the planes of the metallizations of the and drain electrodes so that the gate electrode is a shadow mask in the deposition of metal for the source and drain electrodes;
6. The edge of the source electrode and the edge drain electrode closest to the gate electrode are symmetrically disposed about the gate electrode;
7. The first epitaxial layer is in contact with a substrate comprising indium phosphide; and
8. The first epitaxial region and the second epitaxial region comprise III-V semiconductor compound with composition that is lattice matched to indium phosphide and selected from the group consisting of InGaAs, InGaAsP, InGaAlAs and InP.

2. The semiconductor device of claim 1 in which the first epitaxial region and second epitaxial region comprise the same III-V compound semiconductor.

3. The semiconductor device of claim 2 in which the first epitaxial region comprises n-type InP and the second epitaxial region comprises p-type InP.

4. The semiconductor device of claim 3 in which the n-type InP is doped with an element selected from the group consisting of Sn, Si, S, and Te.

5. The semiconductor device of claim 4 in which the doping concentration ranges from $10^{16}$–$10^{17}$ atoms/cc.

6. The semiconductor device of claim 5 in which the doping concentration is from $8$–$9 \times 10^{16}$ atoms/cc.

7. The semiconductor device of claim 3 in which the p-type InP is doped with an element selected from the group consisting of Cd, Zn, Mg, and Pe.

8. The semiconductor device of claim 7 in which the doping concentration ranges from $10^{18}$–$10^{19}$ atoms/cc.

9. The semiconductor device of claim 2 in which the first epitaxial region is n-type InGaAs and the second epitaxial region is p-type InGaAs.

10. The semiconductor device of claim 9 in which the n-type InGaAs is doped with an element selected from the group consisting of Sn, Si, S, and Te.

11. The semiconductor device of claim 10 in which the doping concentration ranges from $10^{16}$–$10_{17}$ atoms/cc.

12. The semiconductor device of claim 11 in which the doping concentration ranges from $5$–$7 \times 10^{16}$ atoms/cc.

13. The semiconductor device of claim 9 in which the p-type InGaAs is doped with an element selected from the group consisting of Cd, Zn, Mg, and Be.

14. The semiconductor device of claim 13 in which the doping concentration ranges from $10^{18}$–$10^{19}$ atoms/cc.

15. The semiconductor device of claim 1 in which the first epitaxial region and second epitaxial region comprise different III-V semiconductor compounds.

16. The semiconductor device of claim 2 in which the first epitaxial layer is n-type InP and the second epitaxial layer is p-type InGaAs.

17. The semiconductor device of claim 16 in which the n-type InP is doped with an element selected from the group consisting of Sn, Si, S, and Te.

18. The semiconductor device of claim 17 in which the doping concentration ranges from $10^{16}$–$10^{17}$ atoms/cc.

19. The semiconductor device of claim 18 in which the doping concentration ranges from $8$–$9 \times 10^{16}$ atoms/cc.

20. The semiconductor device of claim 16 in which the p-type InGaAs is doped with an element selected from the group consisting of Cd, Zn, Mg, and Be.

21. The semiconductor device of claim 20 in which the doping concentration ranges from $10^{18}$–$10^{19}$ atoms/cc.

22. The semiconductor device of claim 1 in which the first epitaxial layer is n-type InGaAs and the second epitaxial layer is p-type InP.

23. The semiconductor device of claim 22 in which the n-type InGaAs is doped with an element selected from the group Sn, Si, S, and Te.

24. The semiconductor device of claim 23 in which the doping concentration ranges from $10^{16}$–$10^{17}$ atoms/cc.

25. The semiconductor device of claim 24 in which the doping concentration ranges from $5$–$7 \times 10^{16}$ atoms/cc.

26. The semiconductor device of claim 22 in which the p-type InP is doped with an element selected from the group consisting of Cd, Zn, Mg, and Be.

27. The semiconductor device of claim 26 in which the doping concentration ranges from $10^{18}$–$10^{19}$ atoms/cc.

28. The semiconductor device of claim 1 in which the gate electrode is electrically connected to a gate pad.

29. The semiconductor device of claim 28 in which there is an air bridge between gate electrode and gate pad.

30. The semiconductor device of claim 1 in which the source electrode and drain electrode are within 2 μm of the second epitaxial region.

31. The semiconductor device of claim 30 in which the source electrode and drain electrode are within 1.0 μm of the second epitaxial region.

32. The semiconductor device of claim 1 in which the length of the second epitaxial region is less than 5 μm.

33. The semiconductor device of claim 1 in which the overhang of the gate electrode over second epitaxial layer is between 0.3 and 1.0 μm.

34. The semiconductor device of claim 33 in which the overhang is between 0.3 and 0.5 μm.

35. The semiconductor device of claim 1 in which the thickness of the first epitaxial region is less than 1 μm.

36. The semiconductor device of claim 1 in which the thickness of the second epitaxial region is less than 1 μm.

37. The semiconductor device of claim 1 in which the first epitaxial layer is in contact with a buffer layer which is semi-insulating and lattice matched to InP, said buffer in contact with a substrate comprising InP.

38. The semiconductor device of claim 37 in which the buffer layer is semi-insulating InP.

39. The semiconductor device of claim 37 in which the buffer layer is semi-insulating InAlAs lattice matched to InP.

40. The semiconductor device of claim 1 in which a portion of the second epitaxial region in contact with the gate electrode is highly doped with p-type dopant with concentration in the range from $1.0$–$8.0 \times 10^{19}$ atoms/cm$^3$.

* * * * *